(12) United States Patent
Pagaila

(10) Patent No.: US 8,815,650 B2
(45) Date of Patent: Aug. 26, 2014

(54) INTEGRATED CIRCUIT PACKAGING SYSTEM WITH FORMED UNDER-FILL AND METHOD OF MANUFACTURE THEREOF

(75) Inventor: Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 62 days.

(21) Appl. No.: 13/242,656

(22) Filed: Sep. 23, 2011
(Under 37 CFR 1.47)

(65) Prior Publication Data
US 2013/0214430 A1  Aug. 22, 2013

(51) Int. Cl.
*H01L 21/44* (2006.01)
*H01L 21/48* (2006.01)
*H01L 21/50* (2006.01)

(52) U.S. Cl.
USPC ........... 438/127; 438/118; 438/126; 257/686; 257/790

(58) Field of Classification Search
USPC ........... 257/686, 687, 790; 438/118, 126, 127
See application file for complete search history.

(56) References Cited

U.S. PATENT DOCUMENTS

| | | | |
|---|---|---|---|
| 6,057,178 A * | 5/2000 | Galuschki et al. | 438/126 |
| 6,228,679 B1 | 5/2001 | Chiu | |
| 6,717,279 B2 * | 4/2004 | Koike | 257/787 |
| 7,485,502 B2 * | 2/2009 | Jeon et al. | 438/127 |
| 7,550,317 B2 | 6/2009 | Kim | |
| 7,700,414 B1 * | 4/2010 | San Antonio et al. | 438/118 |
| 7,741,726 B2 * | 6/2010 | Jeon et al. | 257/790 |
| 8,421,201 B2 * | 4/2013 | Lee et al. | 257/686 |
| 2009/0001575 A1 * | 1/2009 | Takizawa et al. | 257/738 |
| 2010/0148344 A1 * | 6/2010 | Chandra et al. | 257/690 |
| 2011/0089552 A1 * | 4/2011 | Park et al. | 257/686 |
| 2011/0140283 A1 * | 6/2011 | Chandra et al. | 257/777 |
| 2011/0147911 A1 * | 6/2011 | Kohl et al. | 257/686 |
| 2011/0147912 A1 * | 6/2011 | Karpur et al. | 257/687 |
| 2011/0156234 A1 * | 6/2011 | Hu | 257/687 |
| 2011/0204494 A1 * | 8/2011 | Chi et al. | 257/659 |
| 2012/0326291 A1 * | 12/2012 | Choi et al. | 257/687 |

OTHER PUBLICATIONS

Norman R. Mowrer, "Polysiloxanes", Performance Coatings and Finishes, Nov. 2003, pp. 1-11, Publisher: Ameron International, Published in: US.

* cited by examiner

*Primary Examiner* — Phuc Dang
(74) *Attorney, Agent, or Firm* — Ishimaru & Associates LLP

(57) ABSTRACT

A method of manufacture of an integrated circuit packaging system includes: providing a substrate; mounting an integrated circuit above the substrate with an interconnect directly connecting between the substrate and the integrated circuit; and forming an under-fill between the integrated circuit and the substrate having a cast side.

20 Claims, 8 Drawing Sheets

INTEGRATED CIRCUIT PACKAGING SYSTEM WITH FORMED UNDER-FILL AND METHOD OF MANUFACTURE THEREOF

TECHNICAL FIELD

The present invention relates generally to an integrated circuit packaging system and more particularly to a system for utilizing an under-fill with a substrate in an integrated circuit packaging system.

BACKGROUND

The rapidly growing market for portable electronic devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a substrate; mounting an integrated circuit above the substrate with an interconnect directly connecting between the substrate and the integrated circuit; and forming an under-fill between the integrated circuit and the substrate having a cast side.

The present invention provides an integrated circuit packaging system, including: a substrate; an integrated circuit above the substrate; an interconnect directly connecting between the substrate and the integrated circuit; and an under-fill between the integrated circuit and the substrate having a cast side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
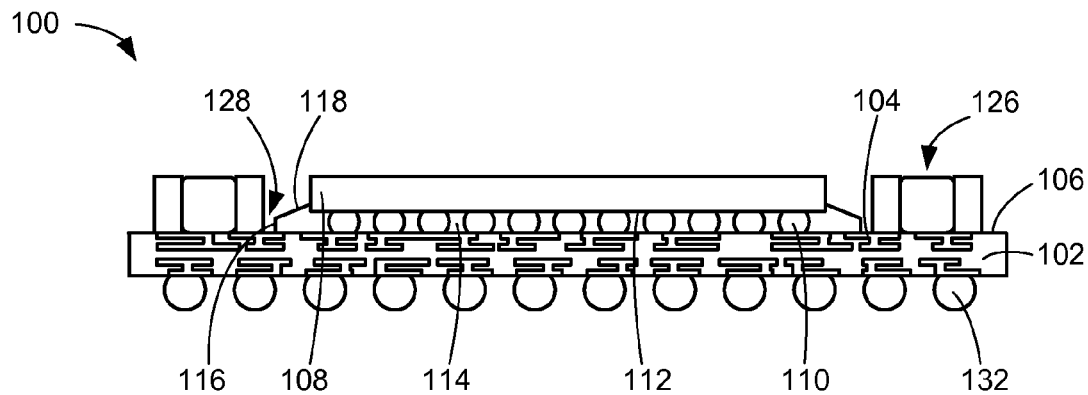
FIG. 1 is a cross-sectional view of an integrated circuit packaging system along the line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of a top surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Figure 2:
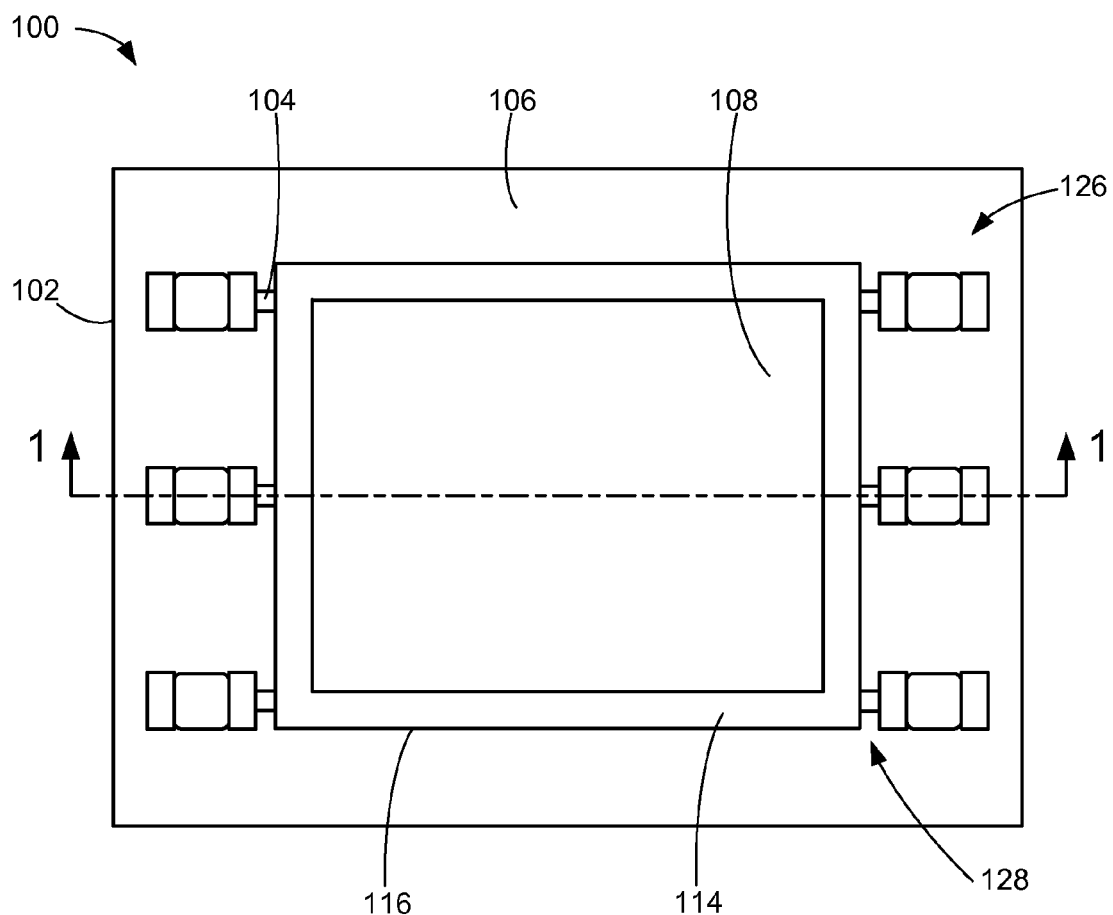
FIG. 2 is a top view of the integrated circuit packaging system of FIG. 1.

Referring now to FIG. 1, therein is shown a cross-sectional view of an integrated circuit packaging system 100 along the line 1-1 of FIG. 2 in a first embodiment of the present invention. The integrated circuit packaging system 100 can be shown having a substrate 102. The substrate 102 is defined as a structure capable of electrical connection, signal routing with internal signal to signal isolation, and providing structural support for components to be mounted thereto. The substrate 102 can be but is not limited to laminated plastic or ceramic.

The substrate 102 can have contacts 104 exposed from a top surface 106 of the substrate 102. The contacts 104 can be embedded within the substrate 102 and serve to electrically connect components above the substrate 102 to the substrate 102.

An integrated circuit 108 can be mounted above and to the substrate 102 and electrically connected to the substrate 102 with interconnects 110. The interconnects 110 can directly connect an active side 112 of the integrated circuit 108 to the top surface 106 of the substrate 102. The active side 112 is defined as a surface having active circuitry fabricated thereon.

An under-fill 114 can be applied around the interconnects 110 and in direct contact with the substrate 102 and the active side 112 of the integrated circuit 108. The under-fill 114 is defined as a liquid applied using a capillary flow process under the integrated circuit 108 then cured to harden.

The under-fill 114 can have cast sides 116 extending vertically up from the top surface 106 of the substrate 102 and terminating at angled surfaces 118. The cast sides 116 are defined as a cured surface of the under-fill 114 maintaining a rigid shape that was cast but is not bounded by a flow restrictor 302 of FIG. 3. The cast sides 116 are spaced away from a peripheral side of the integrated circuit 108.

The cast sides 116 expose and border a portion of the contacts 104 of the substrate 102. The under-fill 114 is cured to have the cast sides 116 and can be depicted as not spreading over the top surface 106 of the substrate 102 past the cast sides 116 but as a compact structure terminating at the cast sides 116 to save valuable space on the substrate 102.

It has been discovered that utilizing the under-fill 114 having the cast sides 116 in combination with the substrate 102 and the integrated circuit 108 greatly reduces the amount of space wasted on the substrate 102 when utilizing the under-fill 114. This allows for greater functionality and density of package components and the contacts 104 while utilizing the substrate 102 with a small footprint.

It has further been discovered that utilizing the under-fill 114 having the cast sides 116 in combination with the substrate 102 can provide increased connection density by bordering the contacts 104 on the top surface 106 of the substrate with the cast sides 116 and exposing the contacts 104 from the under-fill 114. The cast sides 116 can be terminal sides of the under-fill 114 so that the under-fill 114 does not spread horizontally over the substrate 102 past the cast sides 116 increasing the usable area of the substrate 102.

Discrete components 126 can be mounted on the substrate 102 and peripheral to the integrated circuit 108. The discrete components 126 are defined as individually packaged simple components, such as resistors, capacitors, and inductors but can also be diodes, single transistors, voltage regulators, variable capacitance diode, and the like. The discrete components 126 can be in direct contact with the contacts 104 bordered by the cast sides 116 and partially exposed from and partially covered by the under-fill 114. The discrete components 126 are arranged peripheral to the under-fill 114 with a gap 128 between the cast sides 116 of the under-fill 114 and the discrete components 126. External interconnects 132 are formed below the substrate 102.

Referring now to FIG. 2, therein is shown a top view of the integrated circuit packaging system 100 of FIG. 1. As an exemplary illustration, the integrated circuit packaging system 100 can generally be used within a portable electronic device that requires a high level of functional integration, such as a cellphone or computer. The integrated circuit packaging system 100 can be shown having the discrete components 126 mounted on the top surface 106 of the substrate 102.

The discrete components 126 are shown laterally peripheral to the integrated circuit 108 along two opposing sides of the integrated circuit 108, as examples. The discrete components 126 can be mounted along all four perimeter sides of the integrated circuit 108. The discrete components 126 can be shown mounted next to the cast sides 116 of the under-fill 114 with the gap 128 therebetween. The under-fill 114 and the discrete components 126 can be shown over the contacts 104 exposed from the substrate 102. The gap 128 can be large enough to expose a portion of the contacts 104 between the discrete components 126 and the cast sides 116 of the under-fill 114.

Figure 3:
FIG. 3 is a cross-sectional view of the integrated circuit packaging system of FIG. 1 after a flow restrictor forming phase of manufacture.

Referring now to FIG. 3, therein is shown a cross-sectional view of the integrated circuit packaging system 100 of FIG. 1 after a flow restrictor forming phase of manufacture. The integrated circuit packaging system 100 can be shown having the flow restrictor 302 formed on the top surface 106 of the substrate 102 and partially covering some of the contacts 104. The flow restrictor 302 is defined as a structure for the containment of under-fill (not shown) within an encompassed bounded region and restricting flow across the substrate 102.

The flow restrictor 302 can be affixed or formed on the substrate 102 using a spin-coat, screen or stencil printing, or other deposition methods. The flow restrictor 302 should be formed of materials that can withstand the curing process of the under-fill 114 of FIG. 1 like polysiloxane, epoxy siloxane, phenolic siloxane, or a b-staged polymer. The flow restrictor 302 can be a square shape, rectangular shape, or can be deposited in a shape following and surrounding the shape of the integrated circuit 108 of FIG. 1.

Figure 4:
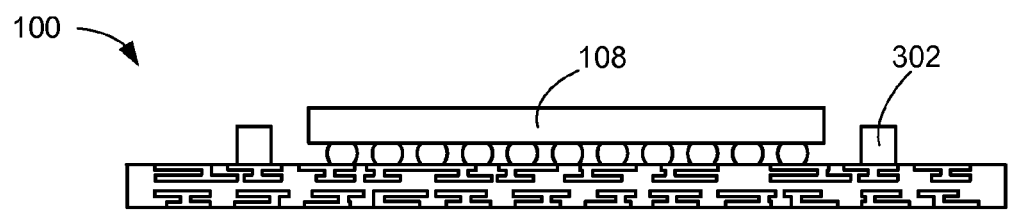
FIG. 4 is a cross-sectional view of the integrated circuit packaging system of FIG. 3 after a die attach phase of manufacture.

Referring now to FIG. 4, therein is shown a cross-sectional view of the integrated circuit packaging system 100 of FIG. 3 after a die attach phase of manufacture. The integrated circuit packaging system 100 can be shown having the integrated circuit 108 mounted interior to the flow restrictor 302 with a distance between the integrated circuit 108 and the flow restrictor 302 of 100-150 μm.

Figure 5:
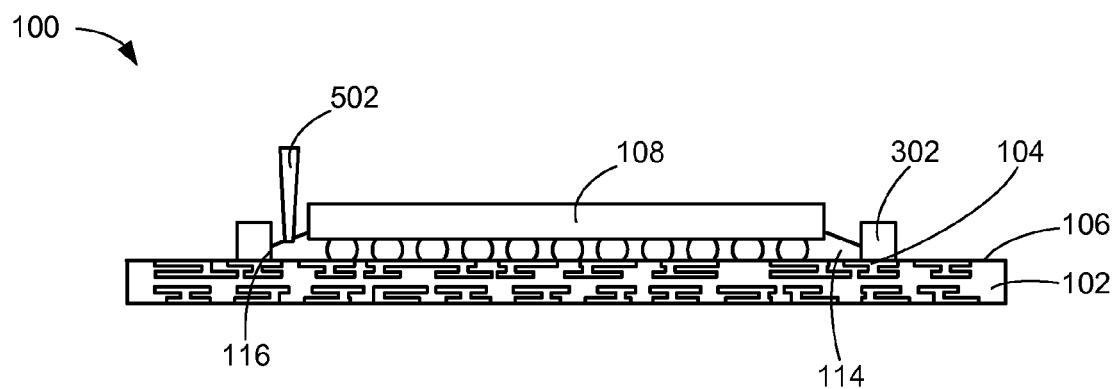
FIG. 5 is a cross-sectional view of the integrated circuit packaging system of FIG. 4 in an under-filling phase of manufacture.

Referring now to FIG. 5, therein is shown a cross-sectional view of the integrated circuit packaging system 100 of FIG. 4 in an under-filling phase of manufacture. The integrated circuit packaging system 100 can be shown having an applicator needle 502 dispensing the under-fill 114 between the integrated circuit 108 and the substrate 102.

The flow restrictor 302 limits the flow of the under-fill 114 horizontally over the top surface 106 of the substrate 102. The flow restrictor 302 also blocks the under-fill 114 from spreading over the contacts 104 under the flow restrictor 302. The cast sides 116 have the characteristics of conforming to the shape of the flow restrictor 302 and can be depicted as planar vertical sides conforming to the similar shape of the flow restrictor 302.

Once the flow restrictor 302 is removed, the contacts 104 will be exposed from the under-fill 114 increasing connection density of the substrate 102. For example, the cast sides 116 are formed 100-150 μm from the integrated circuit 108 in direct contact with the flow restrictor 302.

Figure 6:
FIG. 6 is a cross-sectional view of the integrated circuit packaging system of FIG. 5 after a flow restrictor removal phase of manufacture.

Referring now to FIG. 6, therein is shown a cross-sectional view of the integrated circuit packaging system 100 of FIG. 5 after a flow restrictor removal phase of manufacture. The integrated circuit packaging system 100 can be shown having the flow restrictor 302 of FIG. 3 removed with wet etching, reactive ion etching, heat, or ultra-violet radiation exposure. The substrate 102 can be cleaned using a fluorocarbon-based etchant or plasma to remove traces of the flow restrictor 302 of FIG. 3 while leaving the substrate 102 and the under-fill 114 whole.

Once the flow restrictor 302 of FIG. 3 is removed the cast sides 116 of the under-fill 114 are clearly depicted and increase the functionality of the substrate 102 by increasing the connection points on the substrate 102 available to connect other components. This can increase input/output points to external packages and provide additional points of contact for electro-magnetic shielding or heat spreaders.

The cast sides 116 can have the physical characteristics of chemical traces or etching marks from a wet etch process. The cast sides 116 can have the physical characteristics of pitting from a reactive ion etching process. The cast sides 116 can have the physical characteristics of stress and deformation lines from a heat removal process. The cast sides 116 can have the physical characteristics of surface degradation from an ultra-violet radiation process.

Figure 7:
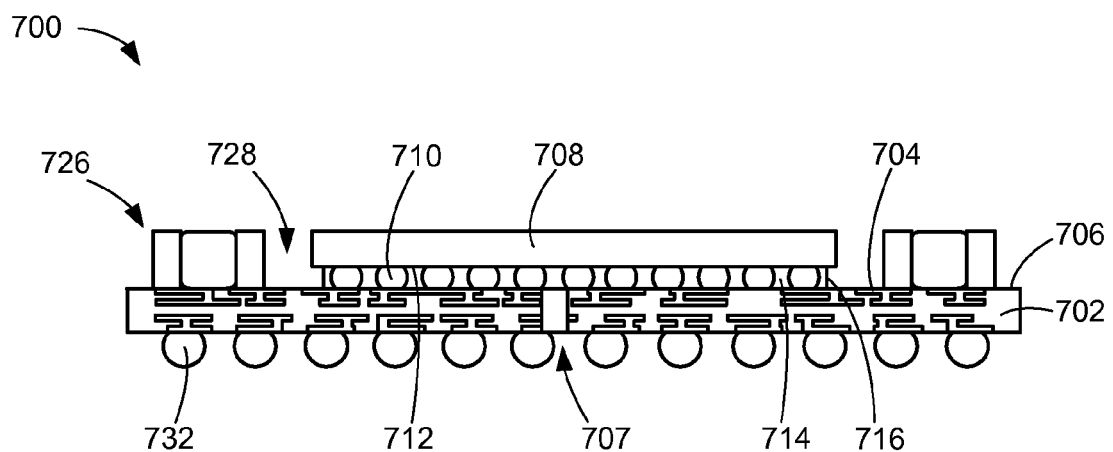
FIG. 7 is a cross-sectional view of an integrated circuit packaging system in a second embodiment of the present invention.

Referring now to FIG. 7, therein is shown a cross-sectional view of an integrated circuit packaging system 700 in a second embodiment of the present invention. The integrated circuit packaging system 700 can be shown having a substrate 702. The substrate 702 is defined as a structure capable of electrical connection, signal routing with internal signal to signal isolation, and providing structural support for components to be mounted thereto. The substrate 702 can be but is not limited to laminated plastic or ceramic.

The substrate 702 can have contacts 704 exposed from a top surface 706 of the substrate 702. The contacts 704 can be embedded within the substrate 702 and serve to electrically connect components above the substrate 702 to the substrate 702. The substrate 702 can also be shown having an opening 707 near the center of the substrate 702 and that traverses the height of the substrate 702.

An integrated circuit 708 can be mounted above the substrate 702 and electrically connected to the substrate 702 with interconnects 710. The interconnects 710 can directly connect an active side 712 of the integrated circuit 708 to the top surface 706 of the substrate 702. The active side 712 is defined as a surface having active circuitry fabricated thereon.

An under-fill 714 can be applied around the interconnects 710, filling the opening 707, and in direct contact with the substrate 702 and the active side 712 of the integrated circuit 708. The under-fill 714 is defined as a liquid applied using a capillary flow process under the integrated circuit 708 then cured to harden.

The under-fill 714 can have cast sides 716 extending vertically up from the top surface 706 of the substrate 702 and terminating at the active side 712 of the integrated circuit 708. The cast sides 716 are defined as a cured surface of the under-fill 714 maintaining a rigid shape that was cast but is not bounded by a flow restrictor 802 of FIG. 8. The cast sides 716 expose and border a portion of the contacts 704 of the substrate 702 and a portion of the active side 712 of the integrated circuit 708. The under-fill 714 is cured to have the cast sides 716 and can be depicted as not spreading over the top surface 706 of the substrate 702 but as a compact structure with the cast sides 716 under the integrated circuit 708 to save valuable space on the substrate 702.

It has been discovered that utilizing the under-fill 714 having the cast sides 716 in combination with the substrate 702 and the integrated circuit 708 greatly reduces the amount of space wasted on the substrate 702 when utilizing the under-fill 714 especially when the cast sides 716 are formed completely within the perimeter of the integrated circuit 708. This allows for greater functionality and density of package components and the contacts 704 while utilizing the substrate 702 with a small footprint.

It has further been discovered that utilizing the under-fill 714 having the cast sides 716 in combination with the substrate 702 can provide increased connection density by bordering the contacts 704 on the top surface 706 of the substrate with the cast sides 716 and exposing the contacts 704 from the under-fill 714. The cast sides 716 can be terminal sides of the under-fill 714 so that the under-fill 714 does not spread horizontally over the substrate 702 past the cast sides 716 increasing the usable area of the substrate 702.

Discrete components 726 can be mounted on the substrate 702 and peripheral to the integrated circuit 708. The discrete components 726 are defined as individually packaged simple components, such as resistors, capacitors, and inductors but can also be diodes, single transistors, voltage regulators, variable capacitance diode, and the like. The discrete components 726 can be in direct contact with the contacts 704. The discrete components 726 are arranged peripheral to the under-fill 714 with a gap 728 between the cast sides 716 of the under-fill 714 and the discrete components 726. External interconnects 732 are formed below the substrate 702.

Figure 8:
FIG. 8 is a cross-sectional view of the integrated circuit packaging system of FIG. 7 after a flow restrictor forming phase of manufacture.

Referring now to FIG. 8, therein is shown a cross-sectional view of the integrated circuit packaging system 700 of FIG. 7 after a flow restrictor forming phase of manufacture. The integrated circuit packaging system 700 can be shown having the flow restrictor 802 formed on the top surface 706 of the substrate 702 and partially covering some of the contacts 704. The flow restrictor 802 is defined as a structure for the containment of under-fill (not shown) within an encompassed bounded region and restricting flow across the substrate 702.

The flow restrictor 802 can be affixed or formed on the substrate 702 using a spin-coat, screen or stencil printing, or other deposition methods. The flow restrictor 702 should be formed of materials that can withstand the curing process of the under-fill 714 of FIG. 7 like polysiloxane, epoxy siloxane, phenolic siloxane, or a b-staged polymer. The flow restrictor 802 can be a square shape, rectangular shape, or can be deposited in a shape following and surrounding the shape of the integrated circuit 708 of FIG. 7.

Figure 9:
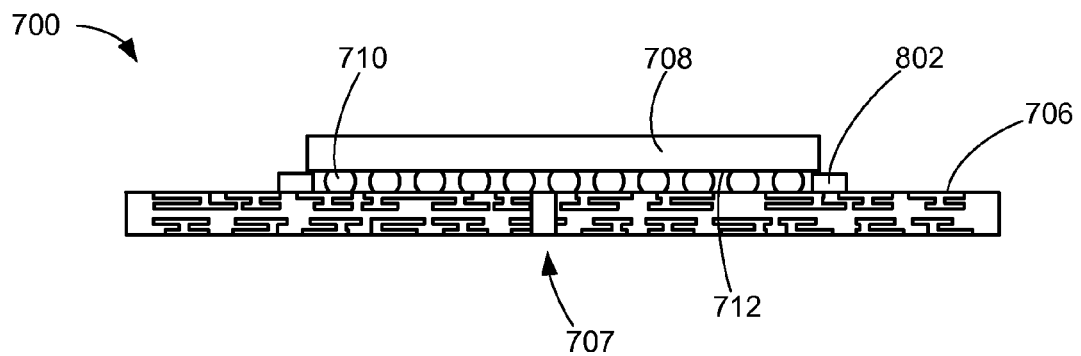
FIG. 9 is a cross-sectional view of the integrated circuit packaging system of FIG. 8 after a die attach phase of manufacture.

Referring now to FIG. 9, therein is shown a cross-sectional view of the integrated circuit packaging system 700 of FIG. 8 after a die attach phase of manufacture. The integrated circuit packaging system 700 can be shown having the integrated circuit 708 mounted over part of the flow restrictor 802 with the active side 712 in direct contact with the flow restrictor 802 and the flow restrictor 802 extending both inside and outside a perimeter of the integrated circuit 708. The opening 707 is between the interconnects 710 connecting the integrated circuit 708 to the top surface 706.

Figure 10:
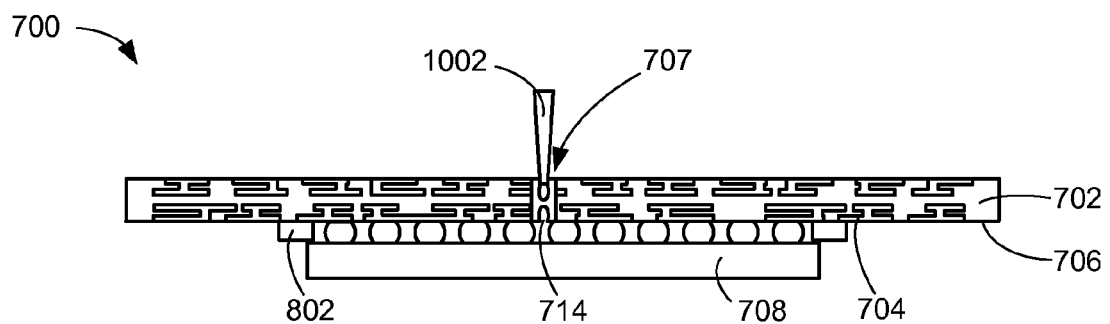
FIG. 10 is a cross-sectional view of the integrated circuit packaging system of FIG. 9 in an under-filling phase of manufacture.

Referring now to FIG. 10, therein is shown a cross-sectional view of the integrated circuit packaging system 700 of FIG. 9 in an under-filling phase of manufacture. The integrated circuit packaging system 700 can be shown having an applicator needle 1002 dispensing the under-fill 714 in the opening 707 of the substrate 702.

The flow restrictor 802 limits the flow of the under-fill 714 horizontally over the top surface 706 of the substrate 702. The flow restrictor 802 also blocks the under-fill 714 from spreading over the contacts 704 under the flow restrictor 802. The cast sides 716 have the characteristics of conforming to the shape of the flow restrictor 802 and can be depicted as planar vertical sides conforming to the similar shape of the flow restrictor 802.

Once the flow restrictor 802 is removed, the contacts 704 will be exposed from the under-fill 714 increasing connection density of the substrate 702. For example, the cast sides 716 are formed 100-150 μm from an outer perimeter edge of the integrated circuit 708 in direct contact with the flow restrictor 802.

Figure 11:
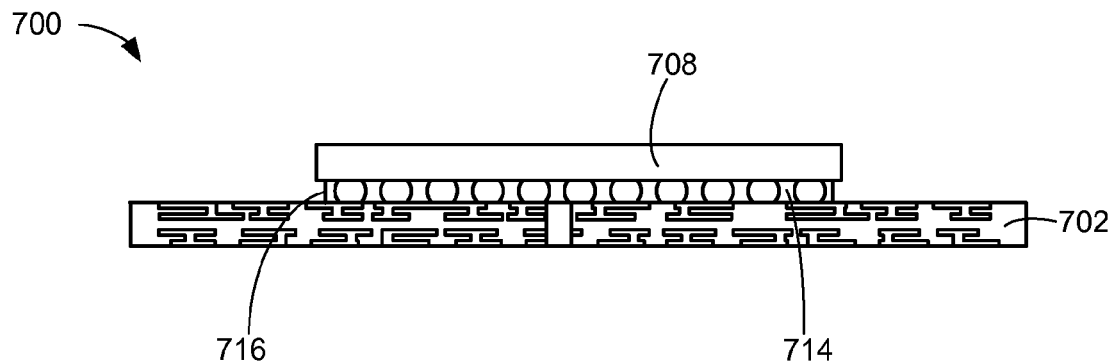
FIG. 11 is a cross-sectional view of the integrated circuit packaging system of FIG. 10 after a flow restrictor removal phase of manufacture.

Referring now to FIG. 11, therein is shown a cross-sectional view of the integrated circuit packaging system 700 of FIG. 10 after a flow restrictor removal phase of manufacture. The integrated circuit packaging system 700 can be shown having the flow restrictor 802 of FIG. 8 removed with wet etching, reactive ion etching, heat, or ultra-violet radiation exposure. The substrate 702 can be cleaned using a fluorocarbon-based etchant or plasma to remove traces of the flow restrictor 802 of FIG. 8 while leaving the substrate 702, the under-fill 714, and the integrated circuit 708 whole.

Once the flow restrictor 802 of FIG. 8 is removed the cast sides 716 of the under-fill 714 are clearly depicted and increase the functionality of the substrate 702 by increasing the connection points on the substrate 702 available to connect other components. This can increase input/output points to external packages and provide additional points of contact for electro-magnetic shielding or heat spreaders.

The cast sides 716 can have the physical characteristics of chemical traces or etching marks from a wet etch process. The cast sides 716 can have the physical characteristics of pitting from a reactive ion etching process. The cast sides 716 can have the physical characteristics of stress and deformation lines from a heat removal process. The cast sides 716 can have the physical characteristics of surface degradation from an ultra-violet radiation process.

Figure 12:
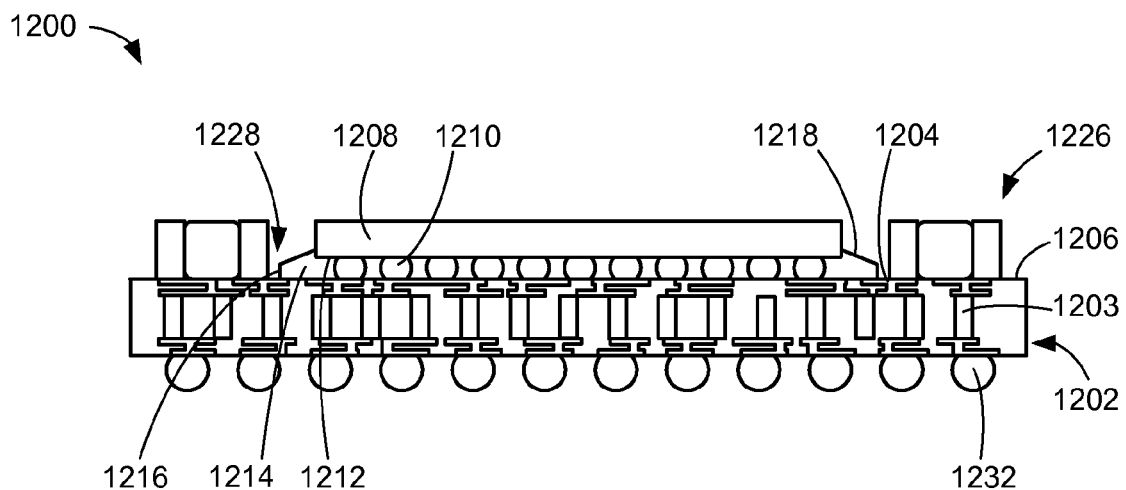
FIG. 12 is a cross-sectional view of an integrated circuit packaging system in a third embodiment of the present invention.

Referring now to FIG. 12, therein is shown a cross-sectional view of an integrated circuit packaging system 1200 in a third embodiment of the present invention. The integrated circuit packaging system 1200 can be shown having a substrate 1202. The substrate 1202 is defined as a structure capable of electrical connection, signal routing with internal signal to signal isolation, and providing structural support for components to be mounted thereto. The substrate 1202 can be shown as a through silicon via structure having vias 1203 traversing vertically through the substrate 1202 and having active circuitry contained within the substrate 1202 and connected to the vias 1203.

The substrate 1202 can have contacts 1204 exposed from a top surface 1206 of the substrate 1202. The contacts 1204 can be embedded within the substrate 1202 and serve to electrically connect components above the substrate 1202 to the substrate 1202.

An integrated circuit 1208 can be mounted above the substrate 1202 and electrically connected to the substrate 1202 with interconnects 1210. The interconnects 1210 can directly connect an active side 1212 of the integrated circuit 1208 to the top surface 1206 of the substrate 1202. The active side 1212 is defined as a surface having active circuitry fabricated thereon.

An under-fill 1214 can be applied around the interconnects 1210 and in direct contact with the substrate 1202 and the active side 1212 of the integrated circuit 1208. The under-fill 1214 is defined as a liquid applied using a capillary flow process under the integrated circuit 1208 then cured to harden.

The under-fill 1214 can have cast sides 1216 extending vertically up from the top surface 1206 of the substrate 1202 and terminating at angled surfaces 1218. The cast sides 1216 are defined as a cured surface of the under-fill 1214 maintaining a rigid shape that was cast but is not bounded by the flow restrictor 302 of FIG. 3.

The cast sides 1216 expose and border a portion of the contacts 1204 of the substrate 1202. The under-fill 1214 is cured to have the cast sides 1216 and can be depicted as not spreading over the top surface 1206 of the substrate 1202 but as a compact structure with the cast sides 1216 to save valuable space on the substrate 1202.

It has been discovered that utilizing the under-fill 1214 having the cast sides 1216 in combination with the substrate 1202 and the integrated circuit 1208 greatly reduces the amount of space wasted on the substrate 1202 when utilizing the under-fill 1214. This allows for greater functionality and density of package components and the contacts 1204 while utilizing the substrate 1202 with a small footprint.

It has further been discovered that utilizing the under-fill 1214 having the cast sides 1216 in combination with the substrate 1202 can provide increased connection density by bordering the contacts 1204 on the top surface 1206 of the substrate with the cast sides 1216 and exposing the contacts 1204 from the under-fill 1214. The cast sides 1216 can be terminal sides of the under-fill 1214 so that the under-fill 1214 does not spread horizontally over the substrate 1202 past the cast sides 1216 increasing the usable area of the substrate 1202.

Discrete components 1226 can be mounted on the substrate 1202 and peripheral to the integrated circuit 1208. The discrete components 1226 are defined as individually packaged simple components, such as resistors, capacitors, and inductors but can also be diodes, single transistors, voltage regulators, variable capacitance diode, and the like. The discrete components 1226 can be in direct contact with the contacts 1204 bordered by the cast sides 1216 and partially exposed from and partially covered by the under-fill 1214. The discrete components 1226 are arranged peripheral to the under-fill 1214 with a gap 1228 between the cast sides 1216 of the under-fill 1214 and the discrete components 1226. External interconnects 1232 are formed below the substrate 1202.

Figure 13:
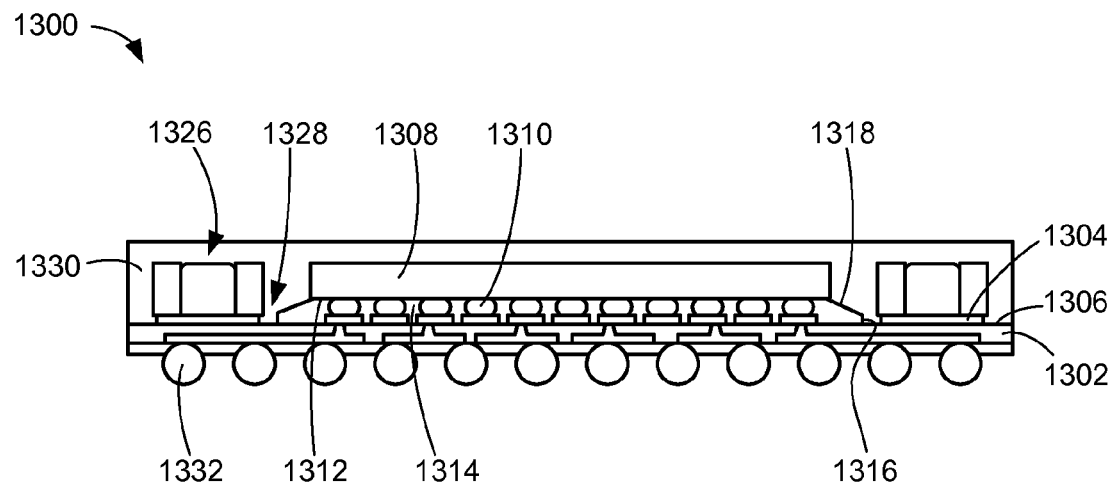
FIG. 13 is a cross-sectional view of an integrated circuit packaging system in a fourth embodiment of the present invention.

Referring now to FIG. 13, therein is shown a cross-sectional view of an integrated circuit packaging system 1300 in a fourth embodiment of the present invention. The integrated circuit packaging system 1300 can be shown having a substrate 1302. The substrate 1302 is defined as a structure capable of electrical connection, signal routing with internal signal to signal isolation, and providing structural support for components to be mounted thereto. The substrate 1302 can be but is not limited to an embedded wafer level ball grid array.

The substrate 1302 can have contacts 1304 exposed from a top surface 1306 of the substrate 1302. The contacts 1304 can extend above the top surface 1306 of the substrate 1302 as solder-wettable pads and serve to electrically connect components above the substrate 1302 to the substrate 1302.

An integrated circuit 1308 can be mounted above the substrate 1302 and electrically connected to the substrate 1302 with interconnects 1310. The interconnects 1310 can directly connect an active side 1312 of the integrated circuit 1308 to the top surface 1306 of the substrate 1302. The active side 1312 is defined as a surface having active circuitry fabricated thereon.

An under-fill 1314 can be applied around the interconnects 1310, the contacts 1304, and in direct contact with the substrate 1302 and the active side 1312 of the integrated circuit 1308. The under-fill 1314 is defined as a liquid applied using a capillary flow process under the integrated circuit 1308 then cured to harden.

The under-fill 1314 can have cast sides 1316 extending vertically up from the top surface 1306 of the substrate 1302 and terminating at angled surfaces 1318. The cast sides 1316 are defined as a cured surface of the under-fill 1314 maintaining a rigid shape that was cast but is not bounded by a flow restrictor 302 of FIG. 3.

The cast sides 1316 expose and border a portion of the contacts 1304 of the substrate 1302. The under-fill 1314 is cured to have the cast sides 1316 and can be depicted as not spreading over the top surface 1306 of the substrate 1302 but as a compact structure with the cast sides 1316 to save valuable space on the substrate 1302.

It has been discovered that utilizing the under-fill 1314 having the cast sides 1316 in combination with the substrate 1302 and the integrated circuit 1308 greatly reduces the amount of space wasted on the substrate 1302 when utilizing the under-fill 1314. This allows for greater functionality and density of package components and the contacts 1304 while utilizing the substrate 1302 with a small footprint.

It has further been discovered that utilizing the under-fill 1314 having the cast sides 1316 in combination with the substrate 1302 can provide increased connection density by bordering the contacts 1304 on the top surface 1306 of the substrate with the cast sides 1316 and exposing the contacts 1304 from the under-fill 1314. The cast sides 1316 can be terminal sides of the under-fill 1314 so that the under-fill 1314 does not spread horizontally over the substrate 1302 past the cast sides 1316 increasing the usable area of the substrate 1302.

Discrete components 1326 can be mounted on the substrate 1302 and peripheral to the integrated circuit 1308. The discrete components 1326 are defined as individually packaged simple components, such as resistors, capacitors, and inductors but can also be diodes, single transistors, voltage regulators, variable capacitance diode, and the like.

The discrete components 1326 can be in direct contact with the contacts 1304 bordered by the cast sides 1316 and partially exposed from and partially covered by the under-fill 1314. The discrete components 1326 are arranged peripheral to the under-fill 1314 with a gap 1328 between the cast sides 1316 of the under-fill 1314 and the discrete components 1326.

An encapsulation 1330 is shown encapsulating the cast sides 1316 and the angled surfaces 1318 of the under-fill 1314, the integrated circuit 1308, the second integrated circuit 1320 and the discrete components 1326. The encapsulation 1330 is defined as a structure that protects sensitive components from moisture, dust and other contamination. The encapsulation 1330 can be glob top, film assist molding, transfer molding, or other encasement structures. External interconnects 1332 are formed embedded in the substrate 1302 as a ball grid array.

Figure 14:
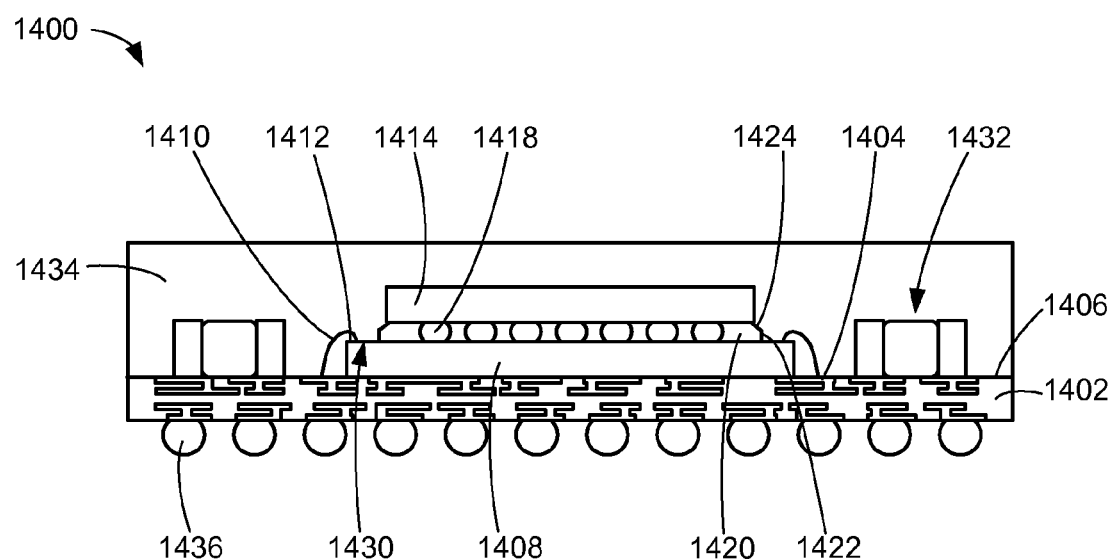
FIG. 14 is a cross-sectional view of an integrated circuit packaging system in a fifth embodiment of the present invention.

Referring now to FIG. 14, therein is shown a cross-sectional view of an integrated circuit packaging system 1400 in a fifth embodiment of the present invention. The integrated circuit packaging system 1400 can be shown having a substrate 1402. The substrate 1402 is defined as a structure capable of electrical connection, signal routing with internal signal to signal isolation, and providing structural support for components to be mounted thereto. The substrate 1402 can be but is not limited to laminated plastic or ceramic.

The substrate 1402 can have contacts 1404 exposed from a top surface 1406 of the substrate 1402. The contacts 1404 can be embedded within the substrate 1402 and serve to electrically connect components above the substrate 1402 to the substrate 1402.

A first integrated circuit 1408 can be mounted above the substrate 1402 and electrically connected to the substrate 1402 with first interconnects 1410 along a perimeter region of the first integrated circuit 1408. The first interconnects 1410 can directly connect an active side 1412 of the first integrated circuit 1408 to the top surface 1406 of the substrate 1402. The active side 1412 is defined as a surface having active circuitry fabricated thereon.

A second integrated circuit 1414 is mounted above the first integrated circuit 1408 directly connected to the active side 1412 with second interconnects 1418. An under-fill 1420 can be shown around the second interconnects 1418 and in direct contact with the active side 1412 of the first integrated circuit 1408 and the second integrated circuit 1414. The under-fill 1420 is defined as a liquid applied using a capillary flow process under the second integrated circuit 1414 then cured to harden.

The under-fill 1420 can have cast sides 1422 extending vertically up from the active side 1412 of the first integrated circuit 1408 and terminating at angled surfaces 1424. The cast sides 1422 are defined as a cured surface of the under-fill 1420 maintaining a rigid shape and not bounded by a flow restrictor (not shown). The angled surfaces 1424 can be depicted as extending from the cast sides 1422 toward the second integrated circuit 1414 and terminating at the second integrated circuit 1414.

The cast sides 1422 expose and border a portion of the active side 1412 of the first integrated circuit 1408. The under-fill 1420 is cured to have the cast sides 1422 and can be depicted as not spreading over the active side 1412 of the first integrated circuit 1408 but as a compact structure with the cast sides 1422 to save valuable space on the active side 1412 of the first integrated circuit 1408.

It has been discovered that utilizing the under-fill 1420 having the cast sides 1422 in combination with the second integrated circuit 1414 over the first integrated circuit 1408 greatly reduces the amount of space wasted on the active side 1412 of the first integrated circuit 1408 when utilizing the under-fill 1420. This allows for greater connection density on the active side 1412 and of the first interconnects 1410.

The first interconnects 1410 are arranged peripheral to the under-fill 1420 with a gap 1430 between the cast sides 1422 of the under-fill 1420 and the first interconnects 1410. Discrete components 1432 can be mounted on the substrate 1402 and peripheral to the first integrated circuit 1408. The discrete components 1432 can be resistors, capacitors, inductors, or some combination thereof. The discrete components 1432 can be in direct contact with the contacts 1404 of the substrate 1402.

An encapsulation 1434 is shown encapsulating the cast sides 1422 and the angled surfaces 1424 of the under-fill 1420, the first integrated circuit 1408, the second integrated circuit 1414 and the discrete components 1432. The encapsulation 1434 is defined as a structure that protects sensitive components from moisture, dust and other contamination. The encapsulation 1434 can be glob top, film assist molding, transfer molding, or other encasement structures. External interconnects 1436 are formed below the substrate 1402.

Figure 15:
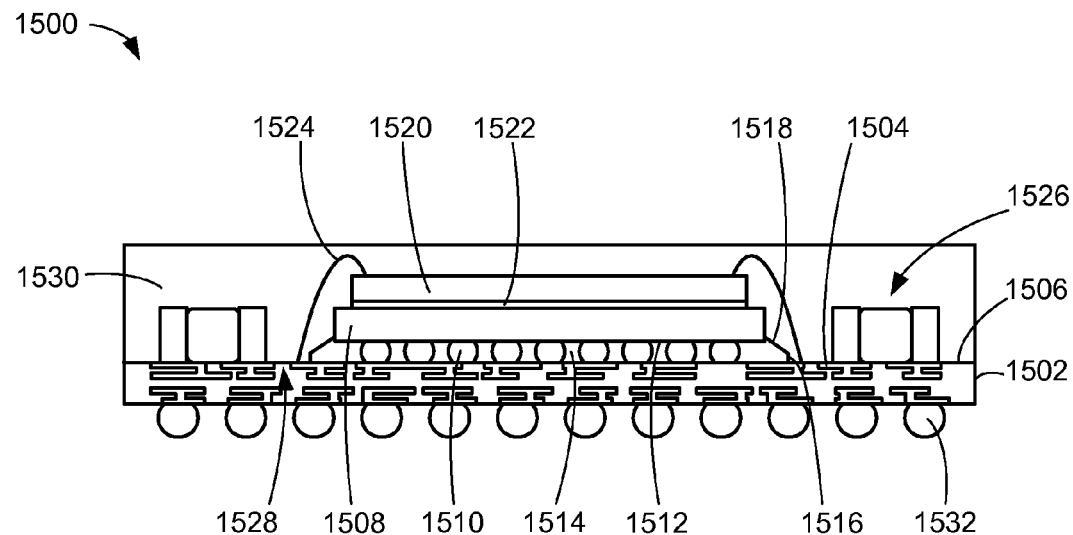
FIG. 15 is a cross-sectional view of an integrated circuit packaging system in a sixth embodiment of the present invention.

Referring now to FIG. 15, therein is shown a cross-sectional view of an integrated circuit packaging system 1500 in a sixth embodiment of the present invention. The integrated circuit packaging system 1500 can be shown having a substrate 1502. The substrate 1502 is defined as a structure capable of electrical connection, signal routing with internal signal to signal isolation, and providing structural support for components to be mounted thereto. The substrate 1502 can be but is not limited to laminated plastic or ceramic.

The substrate 1502 can have contacts 1504 exposed from a top surface 1506 of the substrate 1502. The contacts 1504 can be embedded within the substrate 1502 and serve to electrically connect components above the substrate 1502 to the substrate 1502.

A first integrated circuit 1508 can be mounted above the substrate 1502 and electrically connected to the substrate 1502 with first interconnects 1510. The first interconnects 1510 can directly connect an active side 1512 of the first integrated circuit 1508 to the top surface 1506 of the substrate 1502. The active side 1512 is defined as a surface having active circuitry fabricated thereon.

An under-fill 1514 can be shown around the first interconnects 1510 and in direct contact with the substrate 1502 and the active side 1512 of the first integrated circuit 1508. The under-fill 1514 is defined as a liquid applied using a capillary flow process under the first integrated circuit 1508 then cured to harden.

The under-fill 1514 can have cast sides 1516 extending vertically up from the top surface 1506 of the substrate 1502 and terminating at angled surfaces 1518. The cast sides 1516 are defined as a cured surface of the under-fill 1514 maintaining a rigid shape and not bounded by a flow restrictor (not shown). The angled surfaces 1518 can be depicted as extending from the cast sides 1516 toward the first integrated circuit 1508 and terminating at the first integrated circuit 1508.

The cast sides 1516 expose and border a portion of the contacts 1504 of the substrate 1502. The under-fill 1514 is cured to have the cast sides 1516 and can be depicted as not spreading over the top surface 1506 of the substrate 1502 but as a compact structure with the cast sides 1516 to save valuable space on the substrate 1502.

It has been discovered that utilizing the under-fill 1514 having the cast sides 1516 in combination with the substrate 1502 and the first integrated circuit 1508 greatly reduces the amount of space wasted on the substrate 1502 when utilizing the under-fill 1514. This allows for greater functionality and density of package components and the contacts 1504 while utilizing the substrate 1502 with a small footprint.

It has further been discovered that utilizing the under-fill 1514 having the cast sides 1516 in combination with the substrate 1502 can provide increased connection density by bordering the contacts 1504 on the top surface 1506 of the substrate with the cast sides 1516 and exposing the contacts 1504 from the under-fill 1514. The cast sides 1516 can be terminal sides of the under-fill 1514 so that the under-fill 1514 does not spread horizontally over the substrate 1502 past the cast sides 1516 increasing the usable area of the substrate 1502.

A second integrated circuit 1520 is mounted above the first integrated circuit 1508 and attached to the first integrated circuit 1508 with a die attach adhesive 1522. The second integrated circuit 1520 is connected electrically to the substrate 1502 with second interconnects 1524. The second interconnects 1524 can be in direct contact with the contacts 1504 bordered by the cast sides 1516 and partially exposed from and partially covered by the under-fill 1514.

Discrete components 1526 can be mounted on the substrate 1502 and peripheral to the first integrated circuit 1508. The discrete components 1526 are defined as individually packaged simple components, such as resistors, capacitors, and inductors but can also be diodes, single transistors, voltage regulators, variable capacitance diode, and the like. The discrete components 1526 can be in direct contact with the contacts 1504 of the substrate 1502. The discrete components 1526 are arranged peripheral to the under-fill 1514 with a gap 1528 between the cast sides 1516 of the under-fill 1514 and the discrete components 1526. The gap 1528 can also be depicted between the cast sides 1516 and the second interconnects 1524.

An encapsulation 1530 is shown encapsulating the cast sides 1516 and the angled surfaces 1518 of the under-fill 1514, the first integrated circuit 1508, the second integrated circuit 1520 and the discrete components 1526. The encapsulation 1530 is defined as a structure that protects sensitive components from moisture, dust and other contamination. The encapsulation 1530 can be glob top, film assist molding, transfer molding, or other encasement structures. External interconnects 1532 are formed below the substrate 1502.

Figure 16:
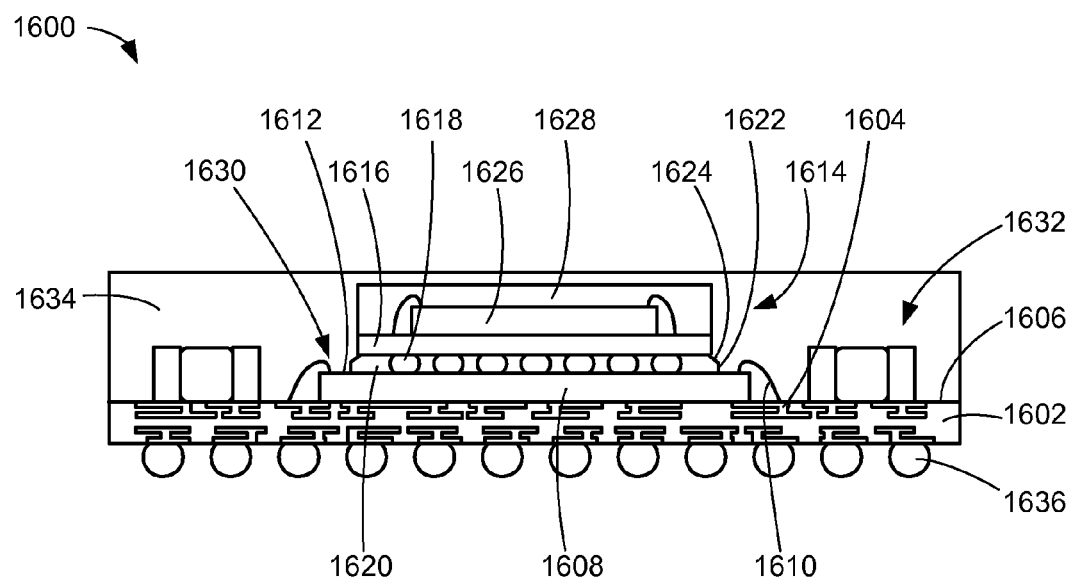
FIG. 16 is a cross-sectional view of an integrated circuit packaging system in a seventh embodiment of the present invention.

Referring now to FIG. 16, therein is shown a cross-sectional view of an integrated circuit packaging system 1600 in a seventh embodiment of the present invention. The integrated circuit packaging system 1600 can be shown having a substrate 1602. The substrate 1602 is defined as a structure capable of electrical connection, signal routing with internal signal to signal isolation, and providing structural support for components to be mounted thereto. The substrate 1602 can be but is not limited to laminated plastic or ceramic.

The substrate 1602 can have contacts 1604 exposed from a top surface 1606 of the substrate 1602. The contacts 1604 can be embedded within the substrate 1602 and serve to electrically connect components above the substrate 1602 to the substrate 1602.

A first integrated circuit 1608 can be mounted above the substrate 1602 and electrically connected to the substrate 1602 with first interconnects 1610 along a perimeter region of the first integrated circuit 1608. The first interconnects 1610 can directly connect an active side 1612 of the first integrated circuit 1608 to the top surface 1606 of the substrate 1602. The active side 1612 is defined as a surface having active circuitry fabricated thereon.

A package 1614 is mounted above the first integrated circuit 1608 with a package substrate 1616 directly connected to the active side 1612 with second interconnects 1618. An under-fill 1620 can be shown around the second interconnects 1618 and in direct contact with the active side 1612 of the first integrated circuit 1608 and the package substrate 1616 of the package 1614. The under-fill 1620 is defined as a liquid applied using a capillary flow process under the package 1614 then cured to harden.

The under-fill 1620 can have cast sides 1622 extending vertically up from the active side 1612 of the first integrated circuit 1608 and terminating at angled surfaces 1624. The cast sides 1622 are defined as a cured surface of the under-fill 1620 maintaining a rigid shape and not bounded by a flow restrictor (not shown). The angled surfaces 1624 can be depicted as extending from the cast sides 1622 toward the package 1614 and terminating at the package substrate 1616.

The cast sides 1622 expose and border a portion of the active side 1612 of the first integrated circuit 1608. The under-fill 1620 is cured to have the cast sides 1622 and can be depicted as not spreading over the active side 1612 of the first integrated circuit 1608 but as a compact structure with the cast sides 1622 to save valuable space on the active side 1612 of the first integrated circuit 1608.

It has been discovered that utilizing the under-fill 1620 having the cast sides 1622 in combination with the package 1614 over the first integrated circuit 1608 greatly reduces the amount of space wasted on the active side 1612 of the first integrated circuit 1608 when utilizing the under-fill 1620. This allows for greater connection density on the active side 1612 and of the first interconnects 1610.

The package 1614 has a second integrated circuit 1626 is mounted above the package substrate 1616. The second integrated circuit 1626 is encapsulated above the package substrate 1616 with a package encapsulation 1628. The package encapsulation 1628 is defined as a structure that protects sensitive components from moisture, dust and other contamination. The package encapsulation 1628 can be glob top, film assist molding, transfer molding, or other encasement structures.

The first interconnects 1610 are arranged peripheral to the under-fill 1620 with a gap 1630 between the cast sides 1622 of the under-fill 1620 and the first interconnects 1610. Discrete components 1632 can be mounted on the substrate 1602 and peripheral to the first integrated circuit 1608. The discrete components 1632 can be resistors, capacitors, inductors, or some combination thereof. The discrete components 1632 can be in direct contact with the contacts 1604 of the substrate 1602.

An encapsulation 1634 is shown encapsulating the cast sides 1622 and the angled surfaces 1624 of the under-fill 1620, the first integrated circuit 1608, the package 1614 and the discrete components 1632. The encapsulation 1634 is defined as a structure that protects sensitive components from moisture, dust and other contamination. The encapsulation 1634 can be glob top, film assist molding, transfer molding, or other encasement structures. External interconnects 1636 are formed below the substrate 1602.

Figure 17:
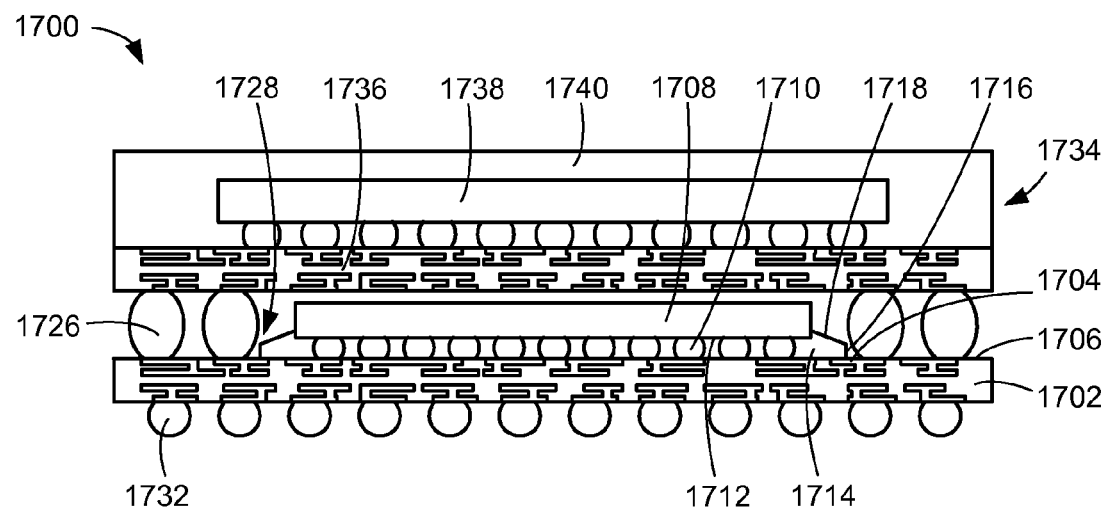
FIG. 17 is a cross-sectional view of an integrated circuit packaging system in an eighth embodiment of the present invention.

Referring now to FIG. 17, therein is shown a cross-sectional view of an integrated circuit packaging system in an eighth embodiment of the present invention. The integrated circuit packaging system 1700 can be shown having a substrate 1702. The substrate 1702 is defined as a structure capable of electrical connection, signal routing with internal signal to signal isolation, and providing structural support for components to be mounted thereto. The substrate 1702 can be but is not limited to laminated plastic or ceramic.

The substrate 1702 can have contacts 1704 exposed from a top surface 1706 of the substrate 1702. The contacts 1704 can be embedded within the substrate 1702 and serve to electrically connect components above the substrate 1702 to the substrate 1702.

An integrated circuit 1708 can be mounted above the substrate 1702 and electrically connected to the substrate 1702 with interconnects 1710. The interconnects 1710 can directly connect an active side 1712 of the integrated circuit 1708 to the top surface 1706 of the substrate 1702. The active side 1712 is defined as a surface having active circuitry fabricated thereon.

An under-fill 1714 can be applied around the interconnects 1710 and in direct contact with the substrate 1702 and the active side 1712 of the integrated circuit 1708. The under-fill 1714 is defined as a liquid applied using a capillary flow process under the integrated circuit 1708 then cured to harden.

The under-fill 1714 can have cast sides 1716 extending vertically up from the top surface 1706 of the substrate 1702 and terminating at angled surfaces 1718. The cast sides 1716 are defined as a cured surface of the under-fill 1714 maintaining a rigid shape that was cast but is not bounded by the flow restrictor 302 of FIG. 3.

The cast sides 1716 expose and border a portion of the contacts 1704 of the substrate 1702. The under-fill 1714 is cured to have the cast sides 1716 and can be depicted as not spreading over the top surface 1706 of the substrate 1702 but as a compact structure with the cast sides 1716 to save valuable space on the substrate 1702.

It has been discovered that utilizing the under-fill 1714 having the cast sides 1716 in combination with the substrate 1702 and the integrated circuit 1708 greatly reduces the amount of space wasted on the substrate 1702 when utilizing the under-fill 1714. This allows for greater functionality and density of package components and the contacts 1704 while utilizing the substrate 1702 with a small footprint.

It has further been discovered that utilizing the under-fill 1714 having the cast sides 1716 in combination with the substrate 1702 can provide increased connection density by bordering the contacts 1704 on the top surface 1706 of the substrate with the cast sides 1716 and exposing the contacts 1704 from the under-fill 1714. The cast sides 1716 can be terminal sides of the under-fill 1714 so that the under-fill 1714 does not spread horizontally over the substrate 1702 past the cast sides 1716 increasing the usable area of the substrate 1702.

Columns 1726 can be mounted or formed on the substrate 1702 and peripheral to the integrated circuit 1708. The columns 1726 can be copper or metal pillars, solder balls, or some conductive structure. The columns 1726 are defined as a structure able to support a structure thereon and able to conduct signals therethrough.

The columns 1726 can be in direct contact with the contacts 1704 bordered by the cast sides 1716 and partially exposed from and partially covered by the under-fill 1714. The columns 1726 are arranged peripheral to the under-fill 1714 with a gap 1728 between the cast sides 1716 of the under-fill 1714 and the columns 1726. External interconnects 1732 are formed below the substrate 1702.

A top package 1734 can be mounted above the integrated circuit 1708 and have a top-package-substrate 1736 in direct contact with the columns 1726. The top-package-substrate 1736 can be depicted having a top-package-chip 1738 connected thereto and encapsulated by a top-package-encapsulation 1740.

Figure 18:
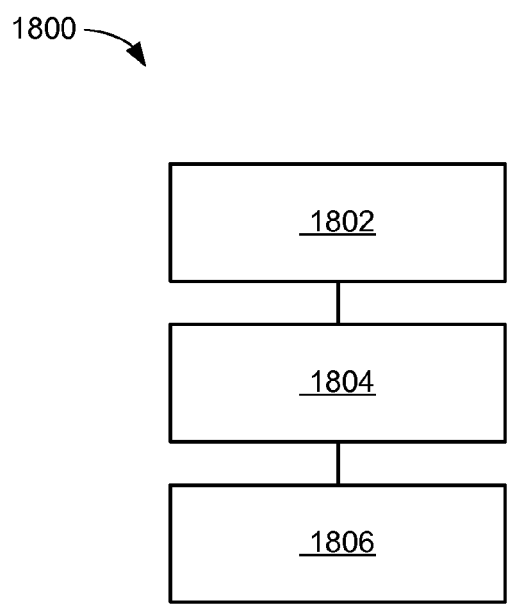
FIG. 18 is a flow chart of a method of manufacture of the integrated circuit packaging system in a further embodiment of the present invention.

Referring now to FIG. 18, therein is shown a flow chart of a method 1800 of manufacture of the integrated circuit packaging system in a further embodiment of the present invention. The method 1800 includes: providing a substrate in a block 1802; mounting an integrated circuit above the substrate with an interconnect directly connecting between the substrate and the integrated circuit in a block 1804; and forming an under-fill between the integrated circuit and the substrate having a cast side in a block 1806.

Thus, it has been discovered that the integrated circuit packaging system and fan in interposer on lead of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   forming a flow restrictor on the substrate;
   mounting an integrated circuit above the substrate and adjacent to the flow restrictor with an interconnect directly connecting between the substrate and the integrated circuit; and
   forming an under-fill between the integrated circuit and the substrate, the under-fill in direct contact with the flow restrictor;
   removing the flow restrictor for creating a cast side of the under-fill spaced away from a peripheral side of the integrated circuit and the cast side formed with the vertical and planar characteristics of having been in direct contact with the flow restrictor.

2. The method as claimed in claim 1 wherein forming the under-fill includes forming the cast side having chemical etchant traces, etching marks, pitting, stress lines, deformation lines, surface degradation or a combination thereof.

3. The method as claimed in claim 1 wherein:
   providing the substrate includes providing the substrate having an opening traversing the height of the substrate; and
   forming the under-fill includes dispensing the under-fill through the opening with the cast side formed between the integrated circuit and the substrate.

4. The method as claimed in claim 1 further comprising forming an encapsulation encapsulating the cast side.

5. The method as claimed in claim 1 further comprising mounting discrete components on the substrate.

6. A method of manufacture of an integrated circuit packaging system comprising:
   providing a substrate;
   forming a flow restrictor on the substrate;
   mounting an integrated circuit above the substrate and adjacent to the flow restrictor with an interconnect directly connecting between the substrate and the integrated circuit;
   forming an under-fill between the integrated circuit and the substrate, and the under-fill in direct contact with the flow restrictor;
   creating a cast side of the under-fill by removing the flow restrictor, the cast side of the under-fill spaced away from a peripheral side of the integrated circuit and the cast side formed with the vertical and planar characteristics of having been in direct contact with the flow restrictor; and
   forming an encapsulation encapsulating the cast side.

7. The method as claimed in claim 6 wherein forming the under-fill having the cast side includes forming the cast side 100-150 μm from the integrated circuit.

8. The method as claimed in claim 6 wherein:
   mounting the integrated circuit includes mounting a first integrated circuit;
   further comprising:
   mounting a second integrated circuit over the first integrated circuit; and
   connecting an interconnect between the substrate and the second integrated circuit and peripheral to the cast side.

9. The method as claimed in claim 6 further comprising:
   mounting a first integrated circuit above the substrate;
   wherein:
   mounting the integrated circuit above the substrate includes mounting a second integrated circuit above the substrate and above the first integrated circuit; and
   forming the under-fill between the integrated circuit and the substrate includes forming the under-fill between the second integrated circuit and the first integrated circuit.

10. The method as claimed in claim 6 further comprising:
    forming columns peripheral to the cast side and above the substrate; and
    mounting a top package above the integrated circuit and connected to the substrate with the columns in direct contact with the top package and the substrate.

11. An integrated circuit packaging system comprising:
a substrate;
an integrated circuit above the substrate;
an interconnect directly connecting between the substrate and the integrated circuit; and
an under-fill between the integrated circuit and the substrate having a cast side, the cast side of the under-fill spaced away from a peripheral side of the integrated circuit and the cast side thinned with the vertical and planar characteristics of having been in direct contact with a flow restrictor which has been formed on and removed from the substrate.

12. The system as claimed in claim 11 wherein the cast side includes chemical etchant traces, etching marks, pitting, stress lines, deformation lines, surface degradation or a combination thereof.

13. The system as claimed in claim 11 wherein:
the substrate has an opening traversing the height of the substrate; and
the under-fill is in the opening and the cast side are between the integrated circuit and the substrate.

14. The system as claimed in claim 11 further comprising an encapsulation encapsulating the cast side.

15. The system as claimed in claim 11 further comprising discrete components mounted on the substrate.

16. The system as claimed in claim 11 further comprising an external interconnect below the substrate.

17. The system as claimed in claim 16 wherein the cast side is 100-150 μm from the integrated circuit.

18. The system as claimed in claim 16 wherein:
the integrated circuit is a first integrated circuit;
further comprising:
a second integrated circuit over the first integrated circuit; and
a second interconnect between the substrate and the second integrated circuit and peripheral to the cast side.

19. The system as claimed in claim 16 further comprising:
a first integrated circuit above the substrate;
wherein:
the integrated circuit is a second integrated circuit above the substrate and above the first integrated circuit; and
the under-fill is between the second integrated circuit and the first integrated circuit.

20. The system as claimed in claim 16 further comprising:
columns peripheral to the cast side and above the substrate; and
a top package above the integrated circuit and connected to the substrate with the columns in direct contact with the top package and the substrate.

* * * * *

UNITED STATES PATENT AND TRADEMARK OFFICE
CERTIFICATE OF CORRECTION

| | | |
|---|---|---|
| PATENT NO. | : 8,815,650 B2 | Page 1 of 1 |
| APPLICATION NO. | : 13/242656 | |
| DATED | : August 26, 2014 | |
| INVENTOR(S) | : Pagaila | |

It is certified that error appears in the above-identified patent and that said Letters Patent is hereby corrected as shown below:

In the Claims:

Column 17, line 9, claim 11, delete "side thinned" and insert therefor
--side formed--

Signed and Sealed this
Fifteenth Day of December, 2015

Michelle K. Lee
*Director of the United States Patent and Trademark Office*